(12) United States Patent
Sung et al.

(10) Patent No.: US 6,303,485 B1
(45) Date of Patent: Oct. 16, 2001

(54) METHOD OF PRODUCING GALLIUM NITRIDE-BASED III-V GROUP COMPOUND SEMICONDUCTOR DEVICE

(75) Inventors: Ying Che Sung; Weng Ming Liu, both of Taoyuan (TW)

(73) Assignee: Arima Optoelectronics Corp., Taoyuan (TW)

(*) Notice: Subject to any disclaimer, the term of this patent is extended or adjusted under 35 U.S.C. 154(b) by 0 days.

(21) Appl. No.: 09/598,039

(22) Filed: Jun. 21, 2000

(51) Int. Cl.[7] ............... H01L 21/28; H01L 21/3205
(52) U.S. Cl. .................................. 438/604; 438/930
(58) Field of Search ........................ 438/604, 605, 438/606, 930, 933

(56) References Cited

U.S. PATENT DOCUMENTS 5,563,422 * 10/1996 Nakamura et al. ............ 257/13
6,093,965 * 7/2000 Nakamura et al. ............ 257/749

* cited by examiner

*Primary Examiner*—David Nelms
*Assistant Examiner*—David Nhu
(74) *Attorney, Agent, or Firm*—Rosenberg, Klein & Lee

(57) ABSTRACT

The present invention proposes a method of producing a gallium nitride-based III-V Group compound semiconductor device. First, beryllium ions are diffused into the p-type layer of gallium nitride to increase hole mobility. Contacts are then added in subsequent procedures, thereby forming contacts having low-impedance ohmic contact layers.

6 Claims, 3 Drawing Sheets

```
┌─────────────────────────┐
│ A FILM OF BERYLLIUM METAL IS ELECTROPLATED ON
│ THE P-TYPE LAYER OF GALLIUM NITRIDE.
└─────────────────────────┘
              │
┌─────────────────────────┐
│ THE BERYLLIUM METAL IS DIFFUSED INTO THE P-TYPE LAYER OF
│ GALLIUM NITRIDE. RESIDUAL BERYLLIUM METAL ON THE P-TYPE LAYER
│ OF GALLIUM NITRIDE IS THEN CLEANED.
└─────────────────────────┘
              │
┌─────────────────────────┐
│ A CONTACT IS DEPOSITED ON THE CLEANED P-TYPE LAYER OF GALLIUM
│ NITRIDE BY EVAPORATION. A HIGH-TEMPERATURE PROCESS IS THEN
│ PERFORMED.
└─────────────────────────┘
```

FIG. 2

METHOD OF PRODUCING GALLIUM NITRIDE-BASED III-V GROUP COMPOUND SEMICONDUCTOR DEVICE

FIELD OF THE INVENTION

The present invention relates to a method of producing a gallium nitride-based III-V Group compound semiconductor device.

BACKGROUND OF THE INVENTION

Compound semiconductor devices have been widely used in communication and for display. Due to recent requirement of blue light sources, gallium nitride-based III-V Group compound semiconductor devices have become the center of research and development. Gallium nitride-based III-V Group compound semiconductor devices generally comprise InGaN, GaAlN, and InAlGaN. The most efficient substrate used to grow gallium nitride-based III-V Group compound semiconductor devices is $Al_2O_3$ single-crystal substrate. However, because the $Al_2O_3$ substrate can not conduct electricity, in producing a device such as a light-emitting diode (LED), its p-contact and n-contact must be fabricated on the same surface and connected to the p-type layer and the n-type layer of the LED via an ohmic contact layer, respectively. The contact is generally made of metallic material of a very thin thickness to prevent from shielding light. Therefore, the electronic characteristic of the ohmic contact layer has an enormous influence on the efficiency of the LED. Moreover, the hole mobility of the p-type layer of gallium nitride-based III-V Group compound semiconductor device is low, resulting in a high impedance of the p-type layer. Therefore, the diffusion of the hole current becomes an issue in the production of this device.

In U.S. Pat. No. 5,563,422, the Nichia company of Japan discloses a method of producing a gallium nitride-based III-V Group compound semiconductor device, wherein a metal film is electroplated on the p-type layer and the diffusion of the hole current is increased by annealing. Because hydrogen atoms bonded with the acceptors will be driven out during the annealing process, the acceptor impurities can be activated so as to improve the electronic characteristic of the ohmic contact layer. However, for metals such as nickel, chromium, aluminum, and gold on the p-type layer of gallium nitride, the efficiency and impedance of the ohmic contact can not be effectively improved.

SUMMARY AND OBJECTS OF THE PRESENT INVENTION

Accordingly, the primary object of the present invention is to provide a method of fabricating a p-contact of a gallium nitride-based III-V Group compound semiconductor device. The proposed method can improve the electronic characteristic of the ohmic contact layer thereof.

To achieve the object, the present invention discloses a method of producing a gallium nitride-based III-V Group compound semiconductor device, wherein beryllium ions are diffused into the p-type layer of gallium nitride so as to increase hole mobility. Contacts are then added in the subsequent fabrication process, thereby forming contacts having low-impedance ohmic contact layers.

The various objects and advantages of the present invention will be more readily understood from the following detailed description when read in conjunction with the appended drawings, in which:

BRIEF DESCRIPTION OF DRAWING

FIG. 2 is a flowchart according to a preferred embodiment of the present invention;

DETAILED DESCRIPTION OF PREFERRED EMBODIMENT

Figure 1:
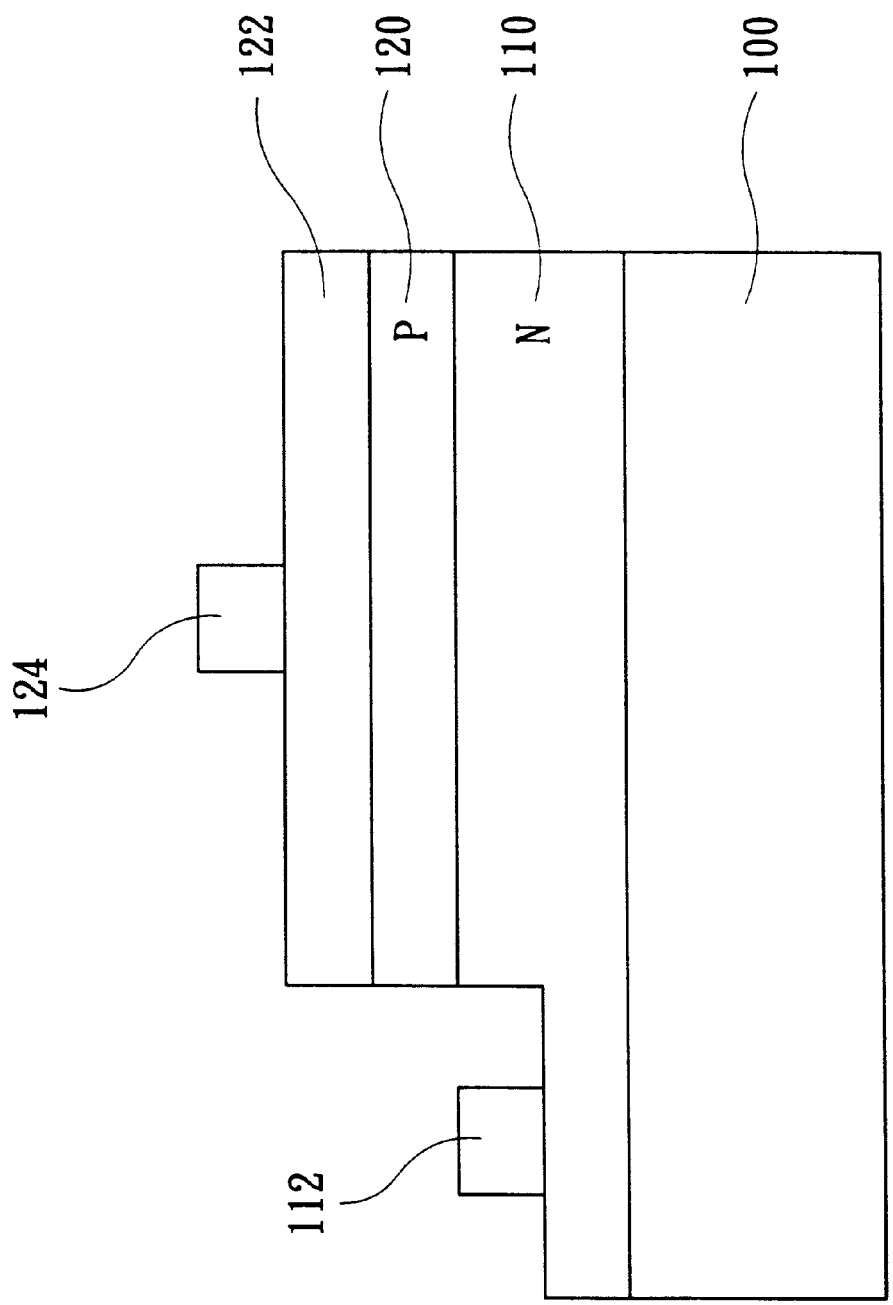
FIG. 1 is a cross-sectional view showing the structure of a device according to the present invention.

FIG. 1 is a cross-sectional view showing the structure of a device according to the present invention. The present invention aims to improve the method of fabricating the p-contact of a gallium nitride-based III-V Group compound semiconductor device (e.g., a gallium nitride-based LED). As shown in FIG. 1, a gallium nitride-based LED comprises mainly a substrate 100, an n-type layer of gallium nitride 110 on the substrate 100, and a p-type layer of gallium nitride 120 superposed on the n-type layer of gallium nitride 110. The substrate 100 can be an $Al_2O_3$ single-crystal substrate so as to achieve better efficiency. Because this kind of substrate can not conduct electricity, the contacts of the LED must be fabricated on the front surface of the LED. As shown in FIG. 1, after the n-type layer of gallium nitride 110 and the p-type layer of gallium nitride 120 superposed thereon are formed, the n-type layer of gallium nitride 110 and the p-type layer of gallium nitride 120 superposed thereon are etched to form a flat platform by the reactive ion etch (RIE) method. The hole mobility of the p-type layer of gallium nitride is low, resulting in a high impedance of the p-type layer. A p-contact 122 is formed on the whole p-type layer of gallium nitride 120, a p-contact solder pad 124 is then formed on the p-contact 122, and a n-contact 112 is formed on the exposed n-type layer of gallium nitride 110. Next, wire-bonding is performed on the n-contact 112 and the p-contact bonding pad 124, thereby achieving electrical connection.

In prior art, hole mobility of the p-type layer of gallium nitride is low. The present invention is characterized in that hole mobility is enhanced so as to form a contact having a low-impedance ohmic contact layer, thereby increasing the efficiency of the gallium nitride-based III-V Group compound semiconductor device.

FIG. 2 shows a flowchart of the method according to a preferred embodiment of the present invention. The method of the present invention comprises the following steps.

(1). A layer of beryllium metal or its alloy (e.g., beryllium-gold alloy) is electroplated on a p-type layer of gallium nitride.

(2). The beryllium metal is diffused into the p-type layer of gallium nitride after placed in a high-temperature environment with nitrogen for 3~15 minutes. The surface is then cleaned.

(3). Nickel of thickness 30~50 Å and beryllium-gold alloy of thickness 70~150 Å are deposited by evaporation. High-temperature process is performed in an environment with nitrogen for 3~15 minutes, thereby forming a transparent conductive film.

In Steps 1 and 2, the temperature of diffusion and high-temperature process is preferred to be within the range of 400~600° C.

Figure 3:
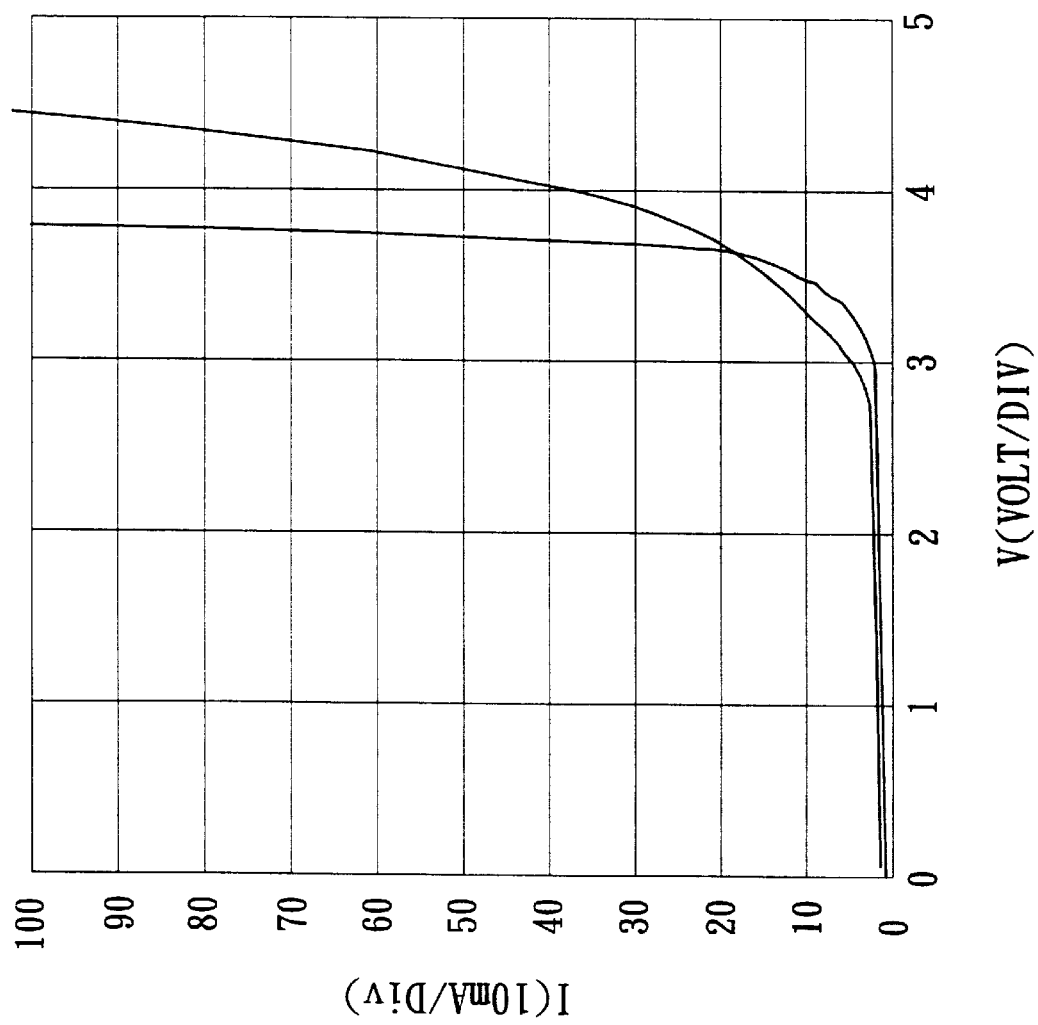
FIG. 3 is a diagram showing the resistance measurement results of a contact fabricated according to the present invention.

FIG. 3 shows the resistance measurement results of a contact fabricated according to the present invention. The resistance of the contact is measured to be 6.25 Ω when the beryllium-diffusion process is not added, while the resistance of the contact is measured to be 1.25 Ω, only ⅕ of the original value, when the beryllium-diffusion process of the present invention is added. Therefore, the method of the present invention can greatly reduced the resistance of the ohmic contact layer of the p-type layer of gallium nitride, thereby improving the efficiency of the LED.

Summing up, the method of the present invention can greatly reduce the resistance of the ohmic contact layer of the p-type layer of gallium nitride.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method of producing a gallium nitride-based III-V Group compound semiconductor device, comprising the steps of:

growing at least a p-type layer of gallium nitride on a substrate, said substrate being made of single-crystal $Al_2O_3$;

electroplating a film of beryllium containing material on exposed surface of said p-type layer of gallium nitride;

performing a diffusion procedure to diffuse said beryllium containing material into said p-type layer of gallium nitride from said electroplated film formed on said exposed surface of said p-type layer of gallium nitride;

cleaning said exposed surface of said p-type layer of gallium nitride from said electroplated film;

forming a p-contact layer by depositing beryllium-gold alloy layer on said cleaned exposed surface of said p-type layer of gallium nitride by evaporation; and, exposing said semiconductor device to a high temperature environment.

2. The method of claim 1, wherein said beryllium containing material in said electroplated film includes beryllium-gold alloy.

3. The method of claim 1, wherein said diffusion procedure is performed in a high-temperature environment of 400–600° C. with nitrogen for duration of 3–15 minutes.

4. The method of claim 1, wherein said p-contact layer further includes nickel layer of thickness 30–50 Å, and wherein said beryllium-gold alloy layer has thickness of 70–150 Å, said layers being deposited by evaporation.

5. The method of claim 1, wherein said semiconductor device is exposed to a high-temperature environment of 400–600° C. with nitrogen for duration 3–15 minutes.

6. The method of claim 1, wherein said beryllium containing material is beryllium metal.

* * * * *